United States Patent [19]

Lantz, II

[11] Patent Number: 5,258,334

[45] Date of Patent: Nov. 2, 1993

[54] PROCESS OF PREVENTING VISUAL ACCESS TO A SEMICONDUCTOR DEVICE BY APPLYING AN OPAQUE CERAMIC COATING TO INTEGRATED CIRCUIT DEVICES

[75] Inventor: Leon Lantz, II, Sykesville, Md.

[73] Assignee: The U.S. Government as represented by the Director, National Security Agency, Fort George G. Meade, Md.

[21] Appl. No.: 4,000

[22] Filed: Jan. 15, 1993

[51] Int. Cl.⁵ .............................................. H01L 21/02
[52] U.S. Cl. ................................... 437/238; 437/236; 437/235; 437/240; 437/982; 148/DIG. 133
[58] Field of Search .............. 437/238, 240, 235, 236, 437/982; 148/DIG. 118, DIG. 133

[56] References Cited

U.S. PATENT DOCUMENTS

| | | | |
|---|---|---|---|
| 3,770,498 | 11/1973 | Flowers | 437/238 |
| 4,133,690 | 1/1979 | Muller | 437/238 |
| 4,544,576 | 10/1985 | Chu et al. | 437/236 |
| 4,756,977 | 7/1988 | Haluska et al. | 428/704 |
| 5,059,448 | 10/1991 | Chandra et al. | 437/238 |
| 5,145,723 | 9/1992 | Ballance et al. | 427/397.7 |

OTHER PUBLICATIONS

Emerging Technologies, U.S. Dept. of Commerce, Spring 1990.

Primary Examiner—Brian E. Hearn
Assistant Examiner—Trung Dang
Attorney, Agent, or Firm—Thomas O. Maser; Robert D. Morelli

[57] ABSTRACT

Reverse engineering of integrated circuit devices is prevented by denying visual access to the topology of an integrated circuit device. Visual access is denied by coating the device with an opaque ceramic. The opaque ceramic is produced by first mixing opaque particulate with a silica precursor. The mixture is then applied to the surface of the integrated circuit device. The coated device is heated to a temperature in the range of 50° C. to 450° C. in an inert environment for a time within the range of 1 second to 6 hours to allow the coating to flow across the surface of the device without ceramifying. The coated device is then heated to a temperature in the range of 20° C. to 1000° C. in a reactive environment for a time in the range of 2 to 12 hours to allow the coating to ceramify. The result is an integrated circuit device that is coated with opaque ceramic which prevents visual access to the underlying circuitry of the integrated circuit device while providing the device with protection against environmental stresses, ionic contamination, and mechanical abrasion.

8 Claims, No Drawings

PROCESS OF PREVENTING VISUAL ACCESS TO A SEMICONDUCTOR DEVICE BY APPLYING AN OPAQUE CERAMIC COATING TO INTEGRATED CIRCUIT DEVICES

TECHNICAL FIELD OF THE INVENTION

This invention relates to a process of forming an opaque ceramic coating on a semiconductor integrated circuit device.

THE PROBLEM

Semiconductor integrated circuit devices are coated with materials such as silicon dioxide ($SiO_2$), silicon nitride ($Si_3N_4$), or polyimides. These coatings protect integrated circuit devices against ionic contamination, moisture, and mechanical abrasion. These coatings, which are transparent, provide no protection against visual access to the topology of the integrated circuit device. For example, U.S. Pat. No. 4,756,977, entitled Multilayer Ceramic From Hydrogen Silsesquioxane, and U.S. Pat. No. 5,145,723, entitled Process For Coating A Substrate With Silica, both disclose the use of a ceramic coating which is transparent. An integrated circuit device can be reverse engineered if its topology can be viewed. Presently, the cost to reverse engineer an integrated circuit device is less then the cost to design one.

In a report, entitled *Emerging Technologies: A Survey of Technical and Economic Opportunities,* published in the spring of 1990 by the U.S. Department of Commerce Technology Administration, it was reported that the U.S. is no longer the world leader in advanced semiconductor devices. The cost of research and market introduction was said to determine the business horizon for new technologies. It was also projected that the advanced semiconductor device industry would be a $75 billion dollar industry by the year 2000. Therefore, a process of preventing reverse engineering of integrated circuit devices is needed in order to protect manufacturers' research investment and market share. Such a process is also needed to prevent the reverse engineering of informationally-sensitive integrated circuits designed by and for the U.S. Government. The reverse engineering of such circuits would be detrimental to the security of the United States.

THE SOLUTION

The main objective of the present invention is to prevent the reverse engineering of integrated circuit devices. This objective is achieved by the development of a process of coating integrated circuit devices with an opaque ceramic coating that prevents visual access to an integrated circuit device while providing the device with protection against environmental stresses, ionic contamination, and mechanical abrasion.

Opaque material is added to a silica precursor to form a coating that will be used to coat an integrated circuit device. The coating is applied to the device. The coating is heated to a temperature that allows the coating to be evenly distributed across the device. The coating is then heated to a temperature which converts the coating to an opaque silica (i.e., ceramic) which prevents visual access to the topology of the integrated circuit device.

DETAILED DESCRIPTION OF THE INVENTION

The present invention prevents the reverse engineering of integrated circuit devices by denying visual access to the topology of an integrated circuit device. This invention is accomplished by applying an opaque ceramic coating to integrated circuit devices.

Processes of coating integrated circuit devices are well known. One such process is disclosed in U.S. Pat. No. 5,145,723 which is hereby incorporated by reference. The present invention improves upon these prior art processes, that result in a transparent coating, by disclosing a process that results in an opaque coating.

The objectives of the present invention are met by adding particulate to ceramic coating-materials in order to produce an opaque and/or colored ceramic coating-material that can then be applied to an integrated circuit device. The particulate makes the ceramic material opaque and/or colored by generating multiple randomly-oriented interfaces and varying indices of refraction within the ceramic material. The particulate may also be used to form opaque color centers within the ceramic material. The particulate includes but is not limited to metallurgical borides, metallurgical carbides, metallurgical nitrides, metallurgical oxides, inorganic pigments, mineral powders, powdered metals, silica, graphite, carbon blacks, and color pigments.

Metallurgical carbide, as used in the present invention, refers to compounds of carbon and other elements, particularly metals and metal-like elements that include the interstitial carbides of the transition metals of Groups IVB, VB, and VIB, and the carbides of Group VIIB and Group VIII metals. The term metallurgical carbides therefore includes such compounds as tungsten carbide, titanium carbide, tantalum carbide, niobium carbide, molybdenum carbide, hafnium carbide, zirconium carbide, chromium carbide, vanadium carbide, and boron carbide as well as complexes such as $(Co,W)_6C$, $(Cr,Fe,Mo)_{23}C_6$, and $(Cr,Fe)_7C_3$.

As used in the present invention, metallurgical nitride refers to compounds of nitrogen and other elements, particularly metal and diamond-like nitrides to include the nitrides of the transition metals of Group IVB, VB, and VIB, and the nitrides of Group IIIA and IVA elements. The term metallurgical nitrides therefore includes such compounds as tungsten nitride, titanium nitride, tantalum nitride, niobium nitride, molybdenum nitride, hafnium nitride, zirconium nitride, chromium nitride, vanadium nitride, silicon nitride, and boron nitride.

Metallurgical oxide, as used in the present invention, refers to compounds of oxygen and other elements, particularly metals and metal-like elements to include the interstitial oxides of the transition metals of Groups IVB, VB, and VIB, and the oxides of Group VIIB and Group VIII metals. The term metallurgical oxides therefore includes such compounds as tungsten trioxide, titanium dioxide, tantalum oxide, niobium oxide, molybdenum dioxide, hafnium oxide, zirconium oxide, chromium dioxide, vanadium trioxide, and zinc oxide.

Metallurgical boride refers to compounds of boron and other elements, particularly metals and metal-like elements to include the borides of the transition metals of Groups IVB, VB, and VIB, and the borides of Group IIA and Group IIIA metals. The term metallurgical borides therefore includes such compounds as tungsten boride, titanium boride, molybdenum boride, hafnium boride, zirconium boride, chromium boride, and vanadium boride.

Pigment, as used in the present invention, refers to any substance which imparts color and/or opacity to the ceramic coating. Inorganic pigment refers to inorganic compounds, particularly metals and metal-like compounds to include but not limited to lead chromates, ferric ammonium cyanides, mercuric sulfides, lead chromates, metal oxides, antimony trisulfide, cadmium pigments, and mixed metal pigments. Color pigment refers to compounds to include but not limited to Azo compounds, phthalocyanines, anthraquinones, and quinacridones.

A single type of particulate or a combination of the various particulates may be added to a silica precursor in order to obtain opaque ceramic. The amount of particulate added to the silica precursor should be in the range of 0.01 to 30.0 weight percent and most preferably in the range of 0.1 to 10.0 weight percent. The particulate may be in the form of fine particles, powders, colloidal suspensions, or solutions. The diameter of a particle should be in the range of 1 to 3000 nanometers and preferably in the range of 10 to 100 nanometers.

The particulate is combined with a silica precursor material to produce an opaque material. The silica precursor material discussed herein is any which has a melting point between 50° C. and 450° C. and which can be converted to silica at a temperature less than about 1000° C. Hydridosilane resins are preferred with hydrogen silsesquioxane resin being particularly preferred.

The silica precursor is first applied to the substrate of an integrated circuit device to form a preceramic coating. Although any conventional method may be used to apply the silica precursor, applying a solution containing the silica precursor and particulate is preferred. If a solution of the preceramic coating is first applied, the silica precursor and one or several types of particulate are first dissolved or suspended in a solvent. To disperse the silica precursor and particulate in a solution, any conventional method including but not limited to stirring, heating, or sonification may be used. Any solvent which can dissolve or suspend the silica precursor and which does not adversely affect the application or integrity of the coating may be used to apply the silica precursor. The solvent can include alcohols, aromatic hydrocarbons, alkanes, ketones, esters, ethers, and polysiloxanes.

The coating solution may be applied to the integrated circuit device by any conventional method including but not limited to flow coating, spray coating, dip coating, or spin coating. The solvent may be evaporated by any conventional method including but not limited to ambient air drying, inert gas drying, vacuum drying, or heating.

After applying the coating to the integrated circuit device, the device is heated in an inert environment for a time and at a temperature sufficient to allow the coating to flow across the surface of the integrated circuit device without ceramifying. To accomplish this, a temperature in the range of 50° C. to 450° C. is preferred while a temperature in the range of 150° C. to 400° C. is most preferred. The time referred to accomplish this, is a time in the range of 1 second to 6 hours. A time less than 1 hour is preferred while a time less than 15 minutes is most preferred. Any inert environment that does not react with the coating, such as argon, helium, nitrogen, or vacuum, can be used during this heating step.

Ceramification of the coating is accomplished by heating the coated integrated circuit device in a reactive environment such as ambient air, oxygen, oxygen plasma, ammonia, or amines. A reactive environment of wet ammonia environment is preferred. The coated integrated circuit device is heated to a temperature in the range of 20° C. to 1000° C. for a time in the range of 2 to 12 hours. It is preferred that the coated integrated circuit device be heated to a temperature in the range of 100° C. to 400° C. for a time not to exceed 2 hours. The heat for conversion of the coating to silica may be applied by any conventional method such as but not limited to convection oven, hot plate, radiant energy, or microwave energy.

By the above method, an opaque ceramic coating is applied to the surface of an integrated circuit device.

What is claimed is:

1. A method of forming an opaque coating on a semiconductor integrated circuit device comprising the steps of:
   a) mixing particulate with a silica precursor having a melting point in the range from 50° C. to 450° C.;
   b) coating said integrated circuit device with said mixture;
   c) heating said coated integrated circuit device a first time to a temperature above the melting point of said silica precursor in an inert environment for a time sufficient to allow said mixture to flow across said integrated circuit device; and
   d) heating said coated integrated circuit device a second time in a reactive environment for a time and at a temperature sufficient to convert said mixture to an opaque silica.

2. The method of claim 1 wherein said particulate is selected from the group consisting of metallurgical borides, metallurgical carbides, metallurgical nitrides, metallurgical oxides, inorganic pigments, mineral powders, powdered metals, silica, graphite, carbon blacks, and color pigments wherein the particulate is present in said mixture in an amount in the range of 0.01 to 30 weight percent.

3. The method of claim 2 wherein said particulate has a diameter in the range of 1 nanometer to 3000 nanometers.

4. The method of claim 3 wherein said silica precursor comprises hydrogen silsesquioxane resin.

5. The method of claim 4 wherein said first heating is done at a temperature in the range of 50° C. to 450° C. for a time less than or equal to 6 hours.

6. The method of claim 5 wherein said inert environment is selected from the group consisting of argon, helium, nitrogen, and vacuum.

7. The method of claim 6 wherein said second heating is done at a temperature in the range of 20° C. to 1000° C. for a time in the range of 2 hours to 12 hours.

8. The method of claim 7 wherein said reactive environment is selected from the group consisting of air, oxygen, oxygen plasma, ammonia, and amines.

* * * * *